(12) United States Patent
Do et al.

(10) Patent No.: US 8,729,694 B2
(45) Date of Patent: May 20, 2014

(54) SEMICONDUCTOR DEVICE AND METHOD OF FORMING CONDUCTIVE VIAS WITH TRENCH IN SAW STREET

(75) Inventors: Byung Tai Do, Singapore (SG); Reza A. Pagaila, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 95 days.

(21) Appl. No.: 13/171,341

(22) Filed: Jun. 28, 2011

(65) Prior Publication Data
US 2011/0254173 A1 Oct. 20, 2011

Related U.S. Application Data

(63) Continuation of application No. 12/484,143, filed on Jun. 12, 2009, now Pat. No. 7,993,976.

(51) Int. Cl.
*H01L 23/48* (2006.01)

(52) U.S. Cl.
USPC ..... 257/693; 257/698; 257/774; 257/E23.011

(58) Field of Classification Search
USPC ............ 257/693, 698, 774, 676, E21, 499, 257/E21.599; 438/113, 458
See application file for complete search history.

(56) References Cited

U.S. PATENT DOCUMENTS

| | | | |
|---|---|---|---|
| 5,998,292 A | 12/1999 | Black et al. | |
| 6,582,992 B2 | 6/2003 | Poo et al. | |
| 6,743,696 B2 | 6/2004 | Jeung et al. | |
| 6,910,268 B2 | 6/2005 | Miller | |
| 7,215,033 B2 | 5/2007 | Lee et al. | |
| 7,276,799 B2 | 10/2007 | Lee et al. | |
| 7,569,421 B2 * | 8/2009 | Do et al. | 438/113 |
| 7,585,750 B2 * | 9/2009 | Do et al. | 438/462 |
| 7,723,159 B2 * | 5/2010 | Do et al. | 438/113 |
| 2008/0230913 A1 | 9/2008 | Huang et al. | |
| 2008/0272476 A1 * | 11/2008 | Do et al. | 257/686 |
| 2008/0272477 A1 * | 11/2008 | Do et al. | 257/686 |
| 2008/0274603 A1 * | 11/2008 | Do et al. | 438/462 |

* cited by examiner

*Primary Examiner* — Jarrett Stark

(74) *Attorney, Agent, or Firm* — Robert D. Atkins; Patent Law Group: Atkins & Associates, P.C.

(57) ABSTRACT

A semiconductor wafer has a plurality of semiconductor die separated by a peripheral region. A trench is formed in the peripheral region of the wafer. A via is formed on the die. The trench extends to and is continuous with the via. A first conductive layer is deposited in the trench and via to form conductive TSV. The first conductive layer is conformally applied or completely fills the trench and via. The trench has a larger area than the vias which accelerates formation of the first conductive layer. A second conductive layer is deposited over a front surface of the die. The second conductive layer is electrically connected to the first conductive layer. The first and second conductive layers can be formed simultaneously. A portion of a back surface of the wafer is removed to expose the first conductive layer. The die can be stacked and electrically interconnected through the TSVs.

31 Claims, 10 Drawing Sheets

SEMICONDUCTOR DEVICE AND METHOD OF FORMING CONDUCTIVE VIAS WITH TRENCH IN SAW STREET

CLAIM OF DOMESTIC PRIORITY

The present application is a continuation of U.S. patent application Ser. No. 12/484,143, now U.S. Pat. No. 7,993,976, filed Jun. 12, 2009, and claims priority to the foregoing parent application pursuant to 35 U.S.C. §120.

FIELD OF THE INVENTION

The present invention relates in general to semiconductor devices and, more particularly, to a semiconductor device and method of forming conductive vias with a trench in the saw street.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

The electrical interconnection between semiconductor packages can be accomplished with conductive through silicon vias (TSVs) or through hole vias (THVs). To form TSVs or THVs, a via is cut through the semiconductor material or peripheral region around each semiconductor die. The vias are filled with an electrically conductive material, for example, copper deposition through an electroplating process.

The TSV and THV formation involves considerable time for the via filling due to its small area. The fully-filled TSV can produce high stress between vias leading to cracking and lower reliability. The equipment needed for electroplating, e.g., plating bath, and sidewall passivation increases manufacturing cost. In addition, voids may be formed within the vias, which causes defects and reduces reliability of the device. TSV and THV can be a slow and costly approach to make vertical electrical interconnections in semiconductor packages. These interconnect schemes also have problems with production yield, large package size, and process cost management.

SUMMARY OF THE INVENTION

A need exists to efficiently and cost effectively form conductive vias to electrically interconnect stacked semiconductor die. Accordingly, in one embodiment, the present invention is a semiconductor device comprising a semiconductor wafer having a plurality of semiconductor die separated by a peripheral region. A plurality of vias is formed in the semiconductor wafer. A trench is formed in the peripheral region of the semiconductor wafer. The trench is continuous with the vias. An insulating layer is formed in the trench and vias. A first conductive layer is deposited over the insulating layer in the trench and via to form conductive TSV. A second conductive layer is formed over a first surface of the semiconductor die. The second conductive layer is electrically connected between the first conductive layer and a contact pad on the semiconductor die.

In another embodiment, the present invention is a semiconductor device comprising a semiconductor wafer having a plurality of semiconductor die separated by a peripheral region. A plurality of vias is formed in the semiconductor wafer. A trench is formed in the peripheral region of the semiconductor wafer. A first conductive layer is deposited in the trench and vias to form conductive vias. A second conductive layer is formed over a first surface of the semiconductor die. The second conductive layer is electrically connected to the first conductive layer.

In another embodiment, the present invention is a semiconductor device comprising a semiconductor wafer having a plurality of semiconductor die containing an active region separated by a non-active peripheral region. A via is formed in the semiconductor wafer partially within the active region and partially within the non-active peripheral region. A trench is formed along a length of the non-active peripheral region of the semiconductor wafer. A first conductive layer is deposited in the trench and via to form a conductive via.

In another embodiment, the present invention is a method of making a semiconductor device comprising the steps of providing a semiconductor wafer having a plurality of semiconductor die separated by a peripheral region, forming a plurality of vias in the semiconductor wafer, forming a trench in the peripheral region of the semiconductor wafer, depositing a first conductive layer in the trench and vias to form conductive vias, and forming a second conductive layer over a first surface of the semiconductor die. The second conductive layer is electrically connected to the first conductive layer.

DETAILED DESCRIPTION OF THE DRAWINGS

Figure 1:
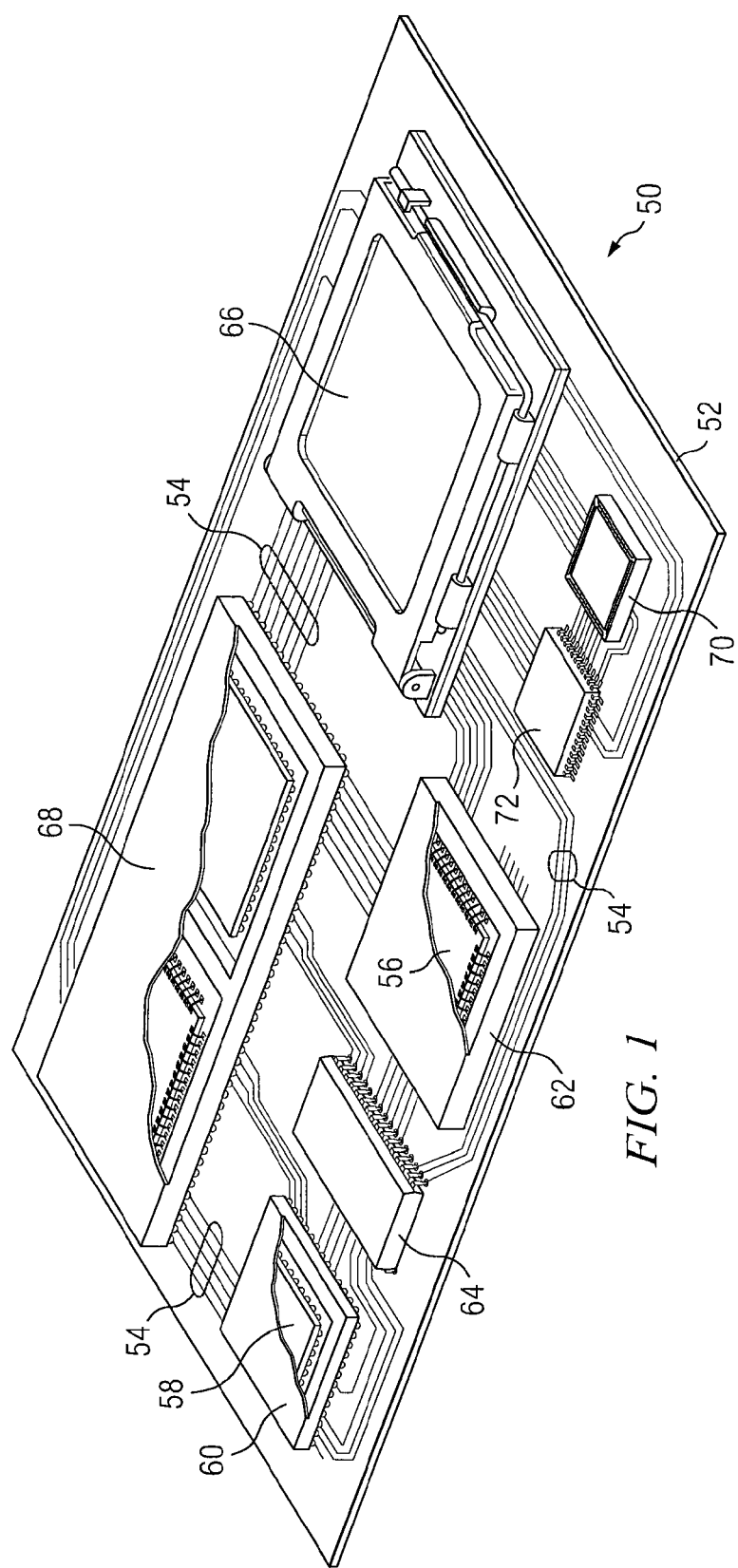
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
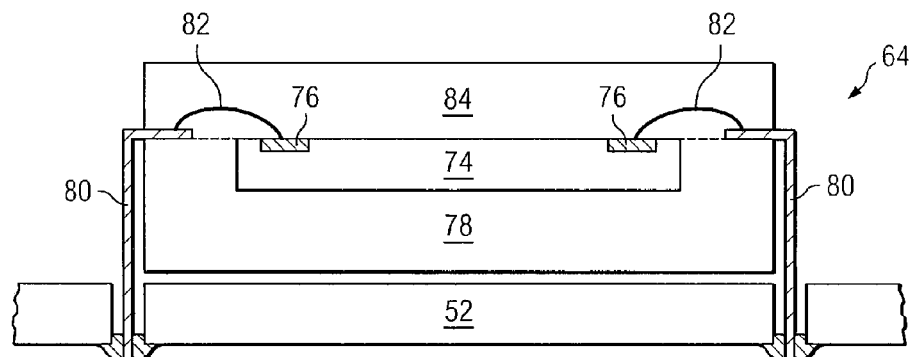
FIGS. 2a-2c illustrate further detail of the representative semiconductor packages mounted to the PCB.
Figure 2B:
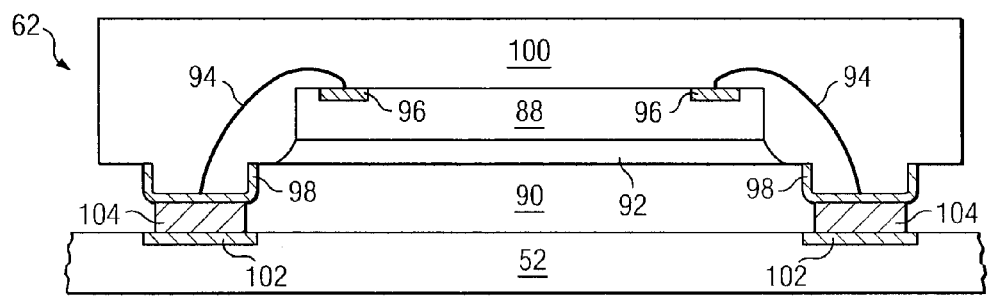
Figure 2C:
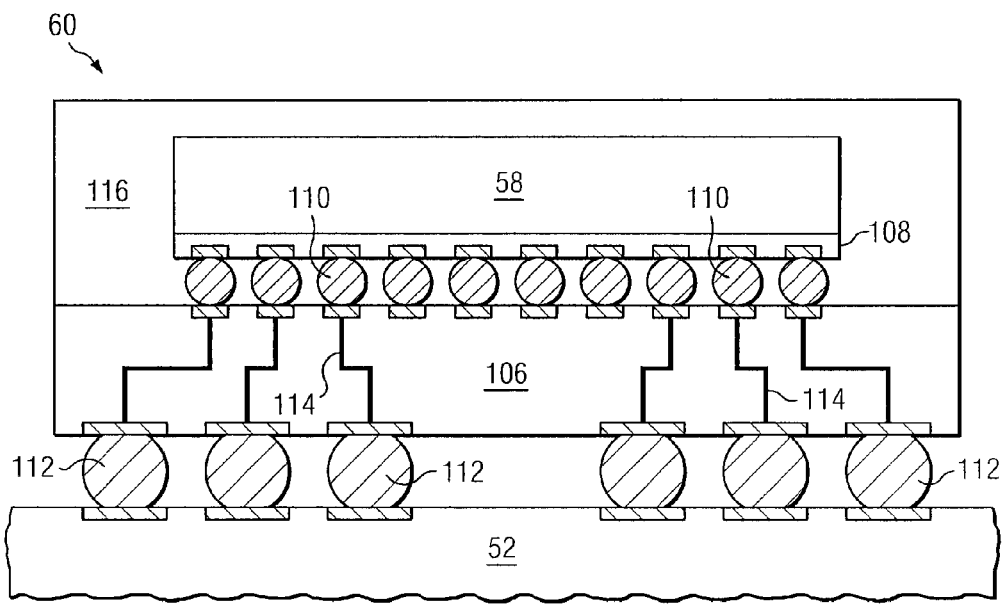

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
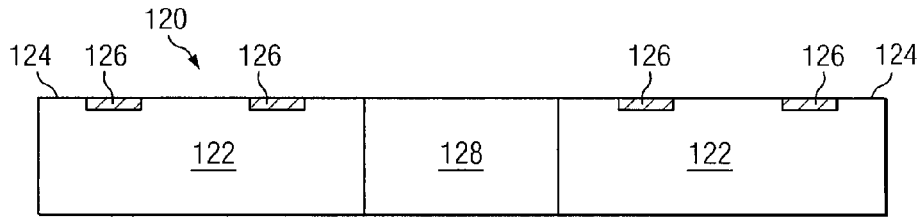
FIGS. 3a-3j illustrate a process of forming conductive vias with partially filled trench in a peripheral region of the die.
Figure 3B:
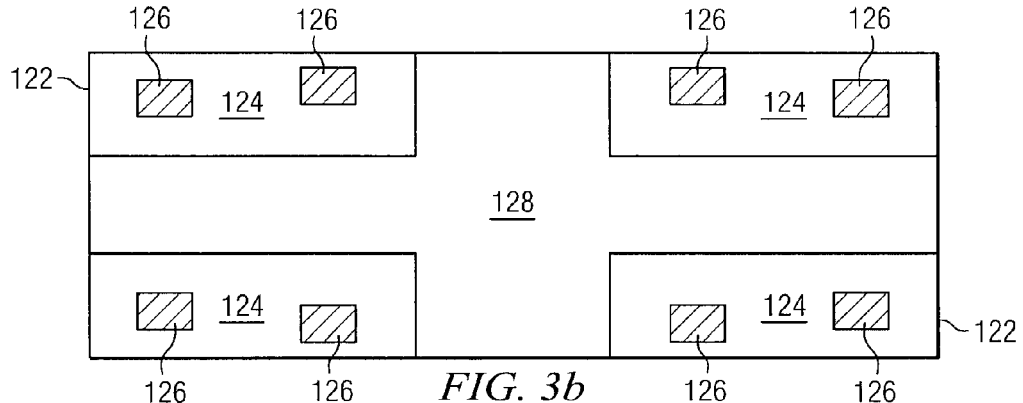

FIGS. 3a-3j illustrate a process of forming conductive vias in a peripheral region around a semiconductor die. In FIG. 3a, a plurality of semiconductor die 122 is formed on semiconductor wafer 120 using conventional integrated circuit processes as described above. Semiconductor die 122 each contain analog or digital circuits implemented as active and passive devices, conductive layers, and dielectric layers formed on active surface 124 and electrically interconnected according to the electrical design of the die. For example, the circuit may include one or more transistors, diodes, and other circuit elements formed within active surface 124 to implement baseband analog circuits or digital circuits, such as digital signal processor (DSP), ASIC, memory, or other signal processing circuit. Semiconductor die 122 may also contain integrated passive devices (IPD), such as inductors, capacitors, and resistors, for radio frequency (RF) signal processing. Contact pads 126 electrically connect to active and passive devices and signal traces in active area 124 of semiconductor die 122. Semiconductor die 122 are separated by saw street 128, which constitute a non-functional, peripheral region of the die, as shown in FIG. 3b.

Figure 3C:
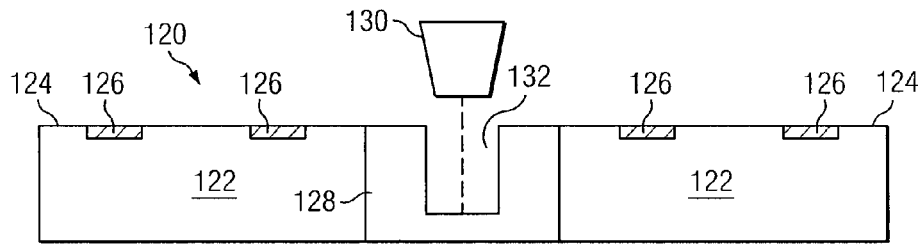
Figure 3D:
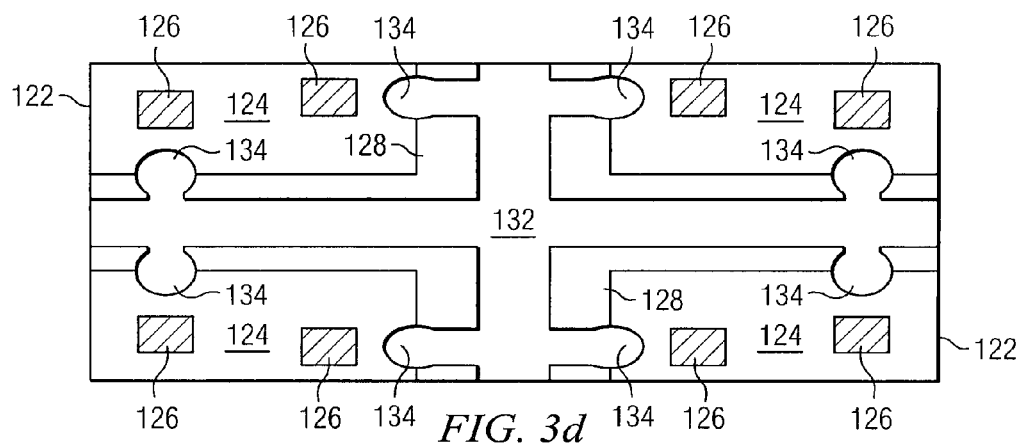

In FIG. 3c, a saw blade or laser tool 130 cuts trench 132 into saw street 128 between semiconductor die 122. In addition, vias 134 are cut into active region 124 of semiconductor die 122 using laser drilling or etching process, such as deep reactive ion etching (DRIE), as shown in FIG. 3d. The cut-out area of trench 132 extends to and is continuous with the cut-out area of vias 134. Trench 132 and vias 134 extend only partially through semiconductor wafer 120. In one embodiment, trench 132 and vias 134 are cut to a depth of 10-100 micrometers (μm), given a wafer thickness of 50-250 μm. More generally, trench 132 and vias 134 are greater than 10 percent of the wafer thickness. Trench 132 has a significantly larger area than via 134. Trench 132 and vias 134 can be formed simultaneously or with separate cutting operations. The walls of trench 132 and vias 134 can be vertical or tapered.

Figure 3E:
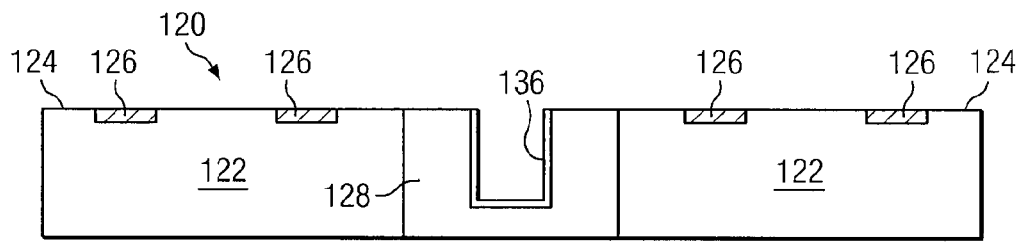
Figure 3F:
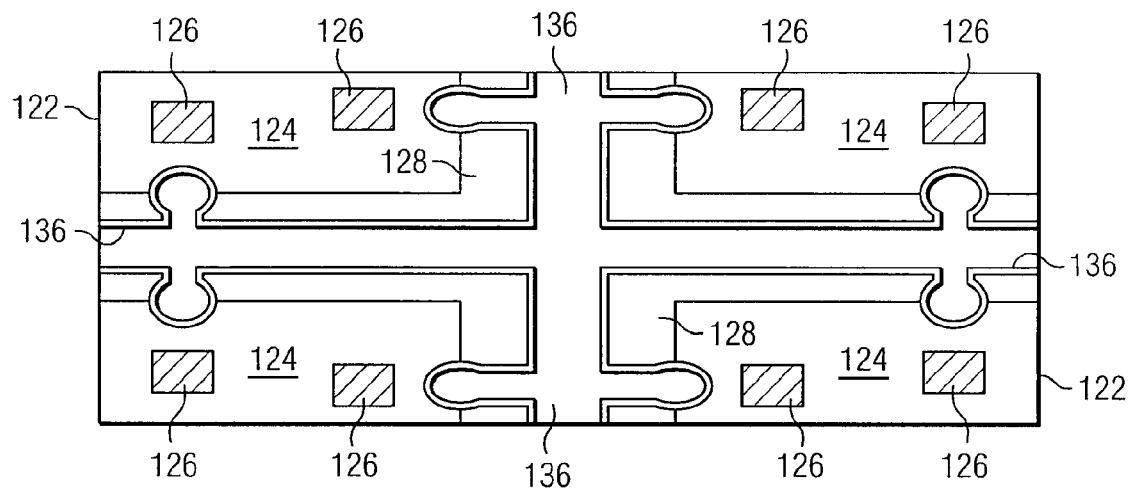

In FIGS. 3e and 3f, an insulating layer 136 is formed in bottom and sidewalls of trench 132 and vias 134 using PVD, CVD, printing, spin coating, spray coating, sintering, or thermal oxidation. The insulating layer 136 can be one or more layers of silicon dioxide (SiO2), silicon nitride (Si3N4), silicon oxynitride (SiON), tantalum pentoxide (Ta2O5), aluminum oxide (Al2O3), or other material having similar insulating properties.

Figure 3G:
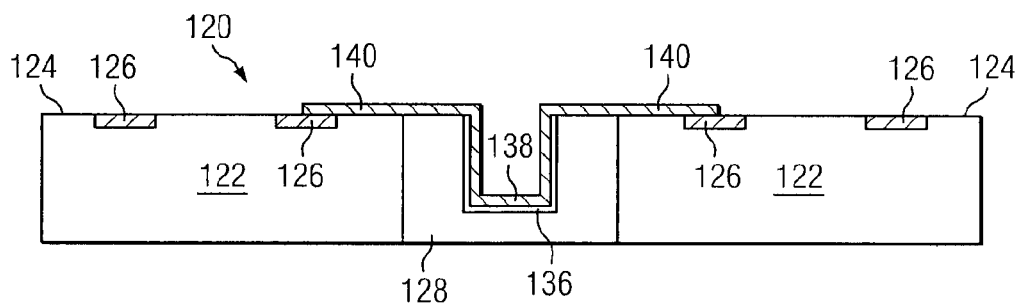
Figure 3H:
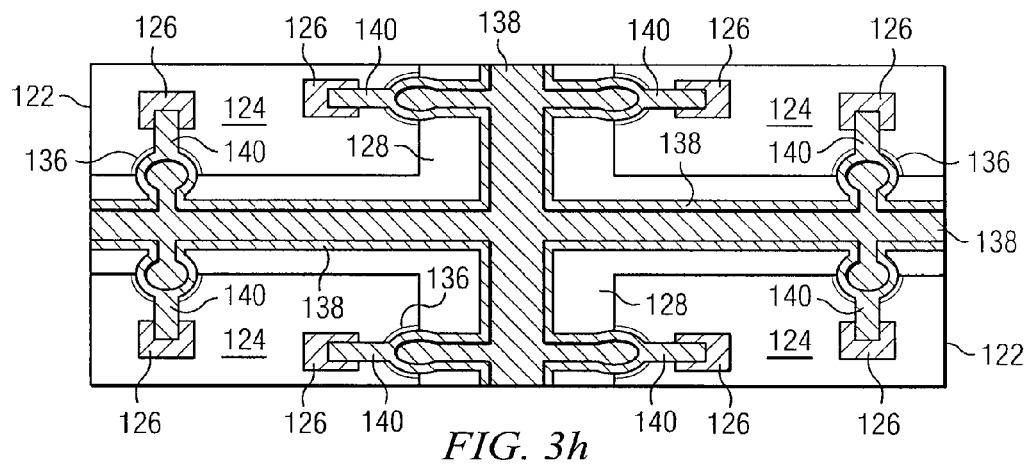

In FIGS. 3g and 3h, an electrically conductive layer 138 is conformally applied into trench 132 and vias 134 using a patterning and deposition process. An electrically conductive layer 140 is also formed over active surface 124 of semiconductor die 122 using a patterning and deposition process. Conductive layer 138 covers the bottom and sidewalls of trench 132 and vias 134. The portion of conductive layer 138 in vias 134 constitutes conductive TSV. Conductive layer 140 operates as a redistribution layer (RDL) or runner to electrically connect conductive layer 138 to contact pads 126. Conductive layers 138 and 140 are formed using PVD, CVD, sputtering, electrolytic plating, electroless plating process, or other suitable metal deposition process. Conductive layers 138 and 140 can be one or more layers of Al, Cu, Sn, Ni, Au, Ag, or other suitable electrically conductive material.

Figure 3I:
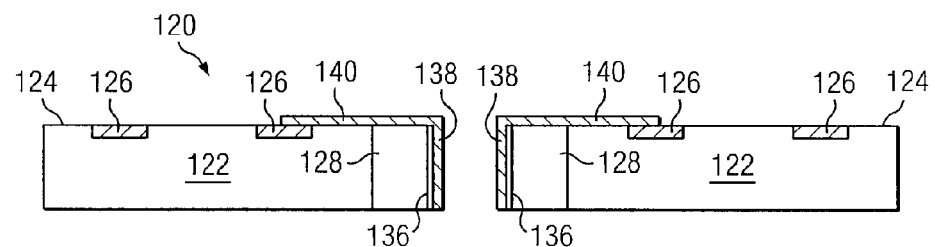
Figure 3J:
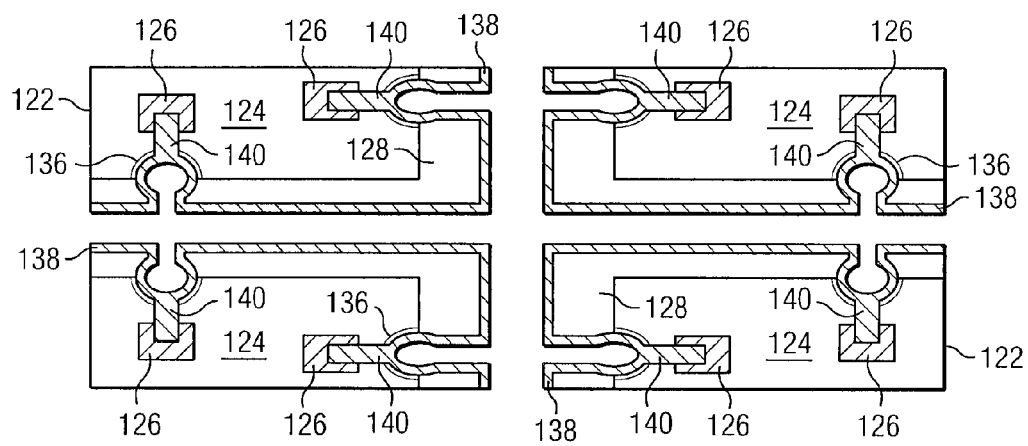
Figure 4A:
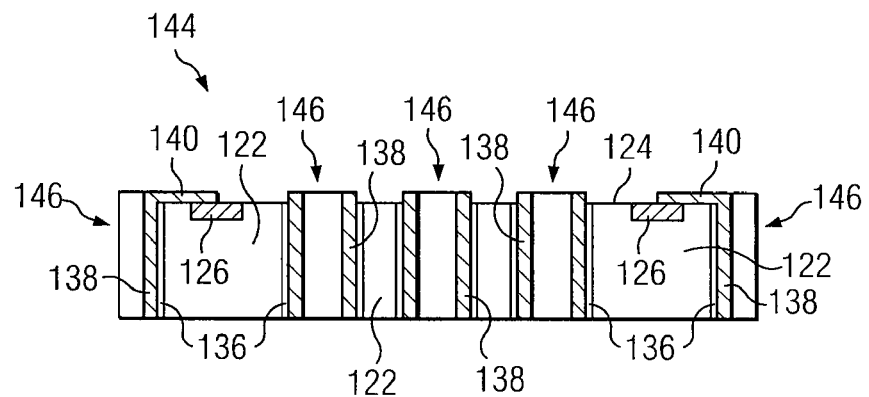
FIGS. 4a-4b illustrate the semiconductor device with conductive vias and RDL.
Figure 4B:
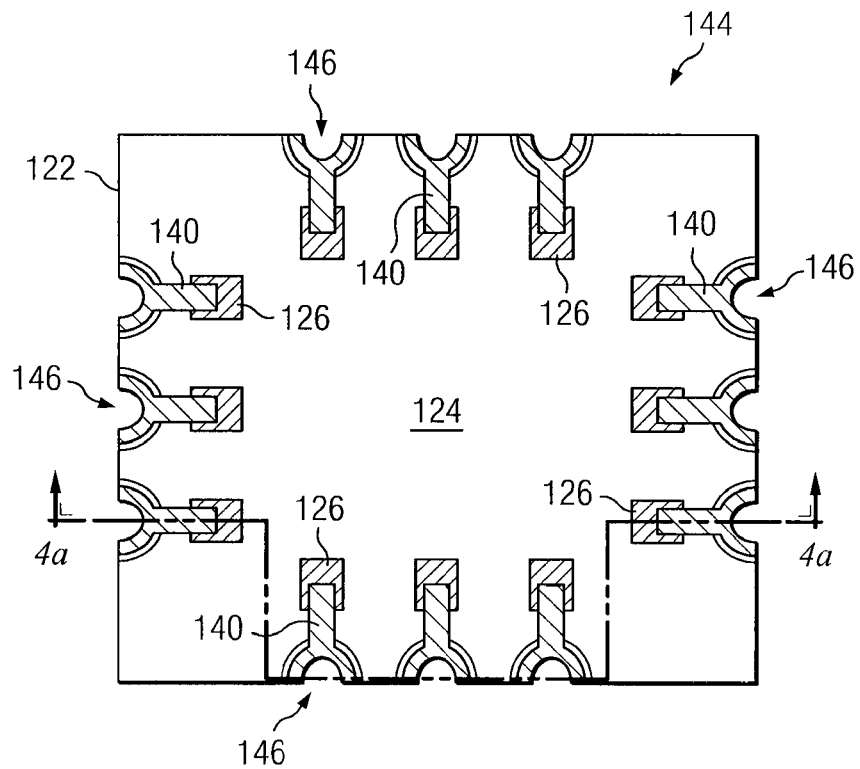
Figure 5:
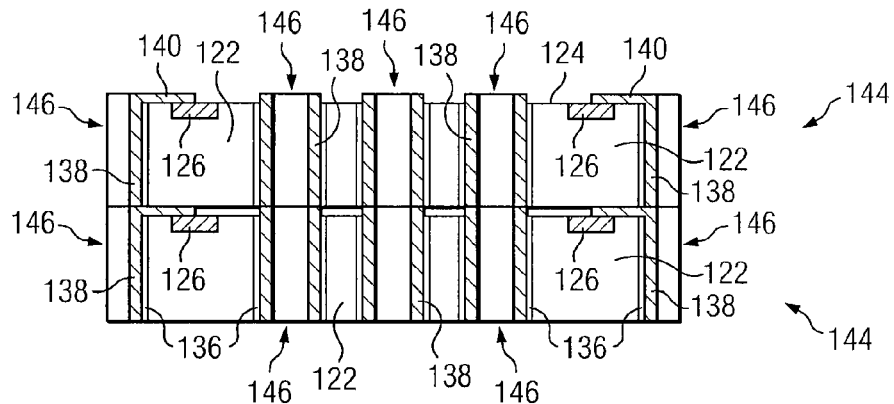
FIG. 5 illustrates vertically stacked semiconductor die electrically connected with conductive vias and RDL.

In FIGS. 3i and 3j, a portion of a back surface of semiconductor wafer 120, opposite active surface 124, is removed by a back-grinding or etching process to singulate semiconductor wafer 120. The portion of insulating layer 136 and conductive layer 138 on the bottom of trench 132 and vias 134 is removed by the back-grinding process to separate semiconductor die 122 into individual semiconductor devices 144. In addition, a saw blade or laser cutting tool removes saw street 128, including the portion of conductive layer 138, to electrically isolate TSVs 146, as shown in FIGS. 4a and 4b. FIG. 5 shows a plurality of stacked semiconductor devices 144 electrically interconnected by TSVs 146 and RDLs 140.

The simultaneous formation of conductive layer 140 and conductive layer 138 in vias 134 to form TSVs 146 simplifies the manufacturing process. The larger area and lower aspect ratio of trench 132 accelerates the formation (e.g., plating) of conductive layer 138 to fill vias 134. Trench 132 also reduces void formation. TSVs 146 are formed along the edge of semiconductor die 122 to dissipate stress inside via 134 to the peripheral area.

Figure 6A:
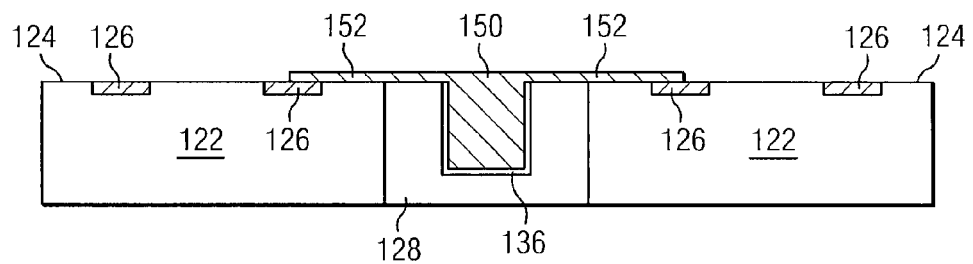
FIGS. 6a-6e illustrate a process of forming conductive vias by fully plating the trench.
Figure 6B:
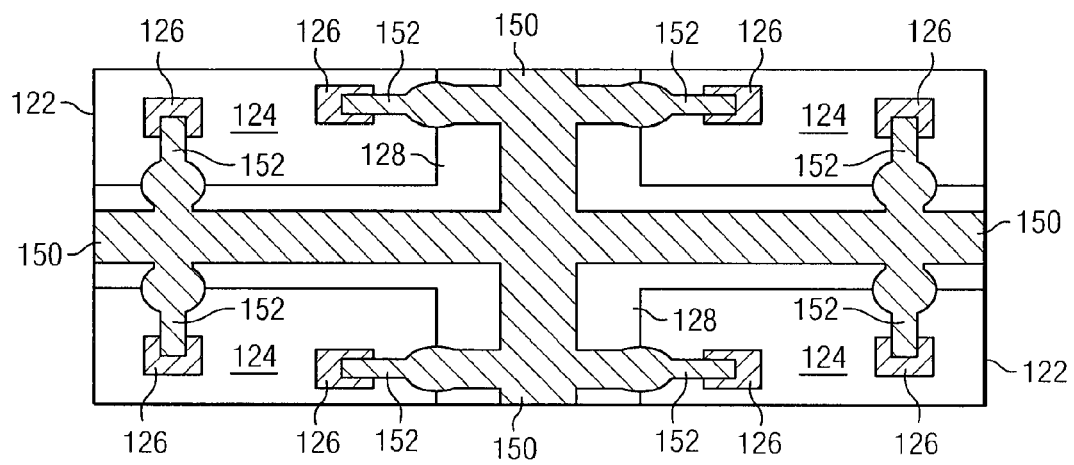

FIGS. 6a-6e illustrate another process of forming conductive vias in the peripheral region around the semiconductor die. The formation of the device follows a similar process as described in FIGS. 3a-3f. After FIG. 3f, an electrically conductive layer 150 is formed in trench 132 and vias 134 using a patterning and deposition process, as shown in FIG. 6a. Conductive layer 150 completely fills or fully plates trench 132 and vias 134. The time required to completely fill or fully plate trench 132 and vias 134 is minimal considering acceleration of the plating process due to the large area and low aspect ratio of the trench. An electrically conductive layer 152 is also formed over active surface 124 of semiconductor die 122 using a patterning and deposition process, see FIG. 6b. Conductive layer 152 operates as an RDL or runner to electrically connect conductive layer 150 to contact pads 126. Conductive layers 150 and 152 are formed using PVD, CVD, sputtering, electrolytic plating, electroless plating process, or other suitable metal deposition process. Conductive layers 150 and 152 can be one or more layers of Al, Cu, Sn, Ni, Au, Ag, or other suitable electrically conductive material.

Figure 6C:
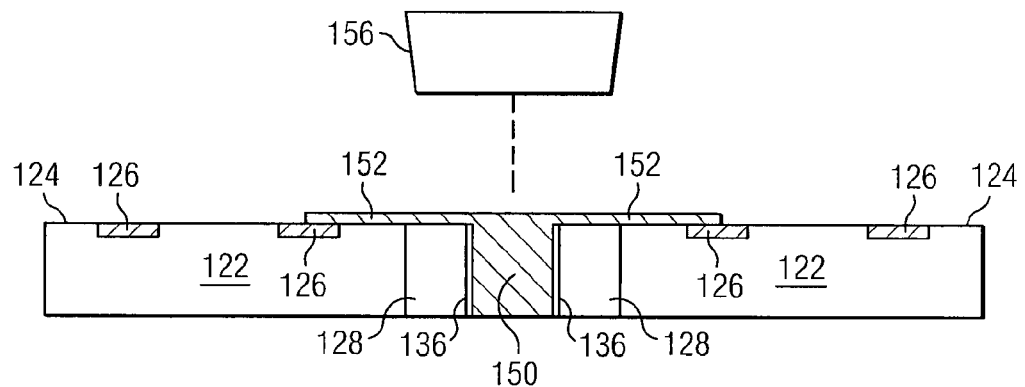
Figure 6D:
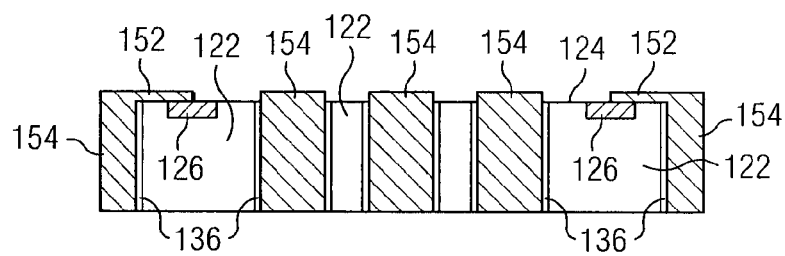
Figure 6E:
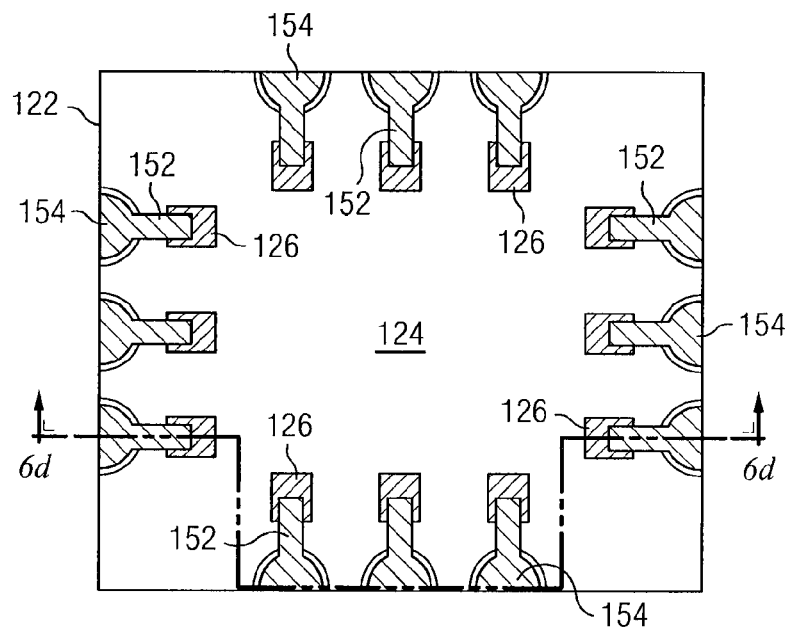

In FIG. 6c, a portion of a back surface of semiconductor wafer 120, opposite active surface 124, is removed by a back-grinding or etching process to expose conductive layer 150. Semiconductor wafer 120 is then singulated through saw street 128 using a saw blade or laser tool 156 to separate semiconductor die 122. The singulation of semiconductor wafer 120 removes saw street 128, including the portion of conductive layer 150, but leaves the portion of conductive layer 150 in vias 134 to form TSVs 154, as shown in FIGS. 6d and 6e.

Figure 7A:
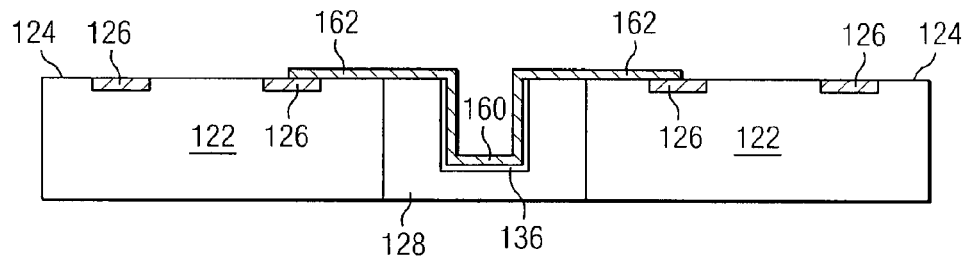
FIGS. 7a-7e illustrate another process of forming conductive vias with the partially filled trench in the peripheral region of the die.
Figure 7B:
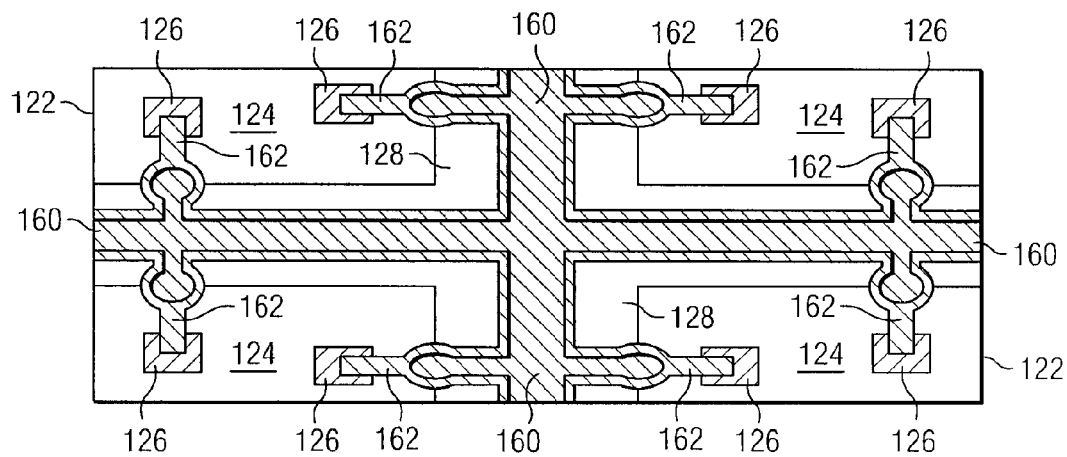

FIGS. 7a-7e illustrate another process of forming conductive vias in the peripheral region around the semiconductor die. The formation of the device follows a similar process as described in FIGS. 3a-3f. After FIG. 3f, an electrically conductive layer 160 is conformally applied into trench 132 and vias 134 using a patterning and deposition process, as shown in FIGS. 7a and 7b. An electrically conductive layer 162 is also formed over active surface 124 of semiconductor die 122 using a patterning and deposition process. Conductive layer 160 covers the bottom and sidewalls of trench 132 and vias 134. The portion of conductive layer 160 in vias 134 constitutes TSVs. Conductive layer 162 operates as an RDL or runner to electrically connect conductive layer 160 to contact pads 126. Conductive layers 160 and 162 are formed using PVD, CVD, sputtering, electrolytic plating, electroless plating process, or other suitable metal deposition process. Conductive layers 160 and 162 can be one or more layers of Al, Cu, Sn, Ni, Au, Ag, or other suitable electrically conductive material.

Figure 7C:
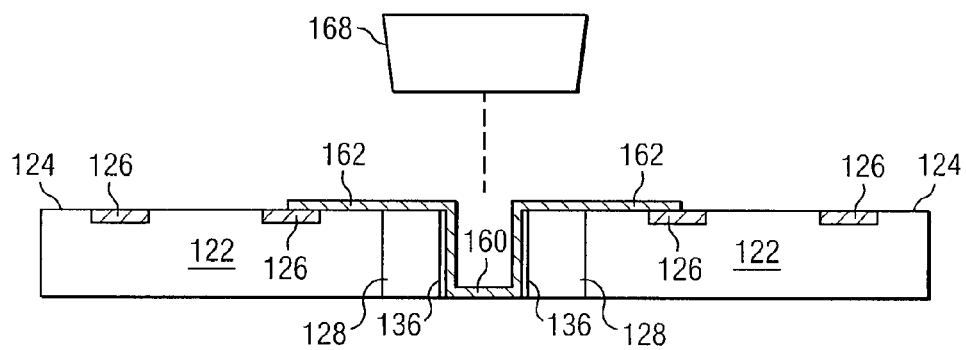
Figure 7D:
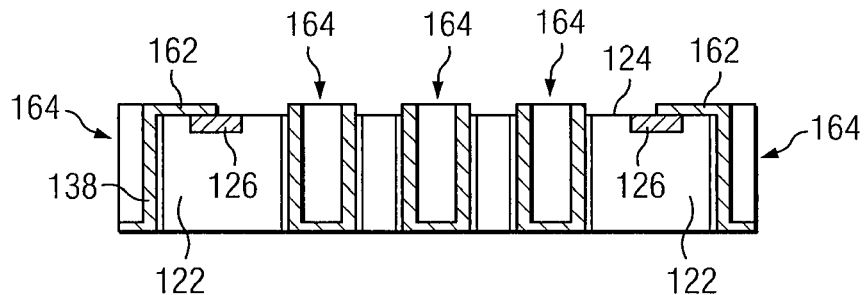
Figure 7E:
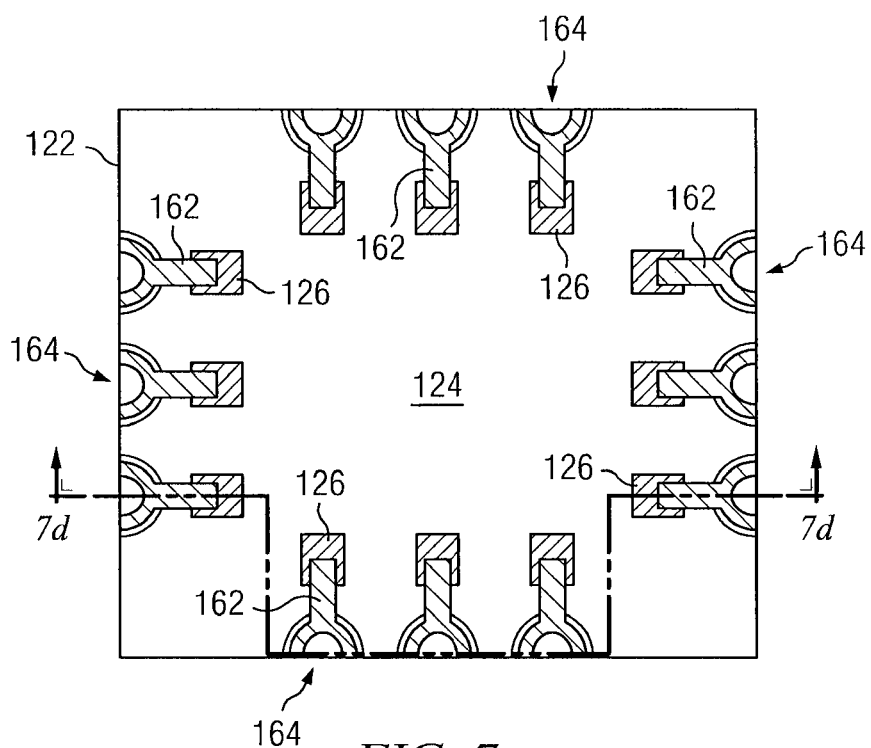

In FIG. 7c, a portion of a back surface of semiconductor wafer 120, opposite active surface 124, is removed by a back-grinding or etching process. The portion of conductive layer 160 on the bottom of trench 132 and vias 134 remains in place. Semiconductor wafer 120 is then singulated through saw street 128 using a saw blade or laser tool 168 to separate semiconductor die 122, as shown in FIG. 7d. The singulation of semiconductor wafer 120 removes saw street 128, including the portion of conductive layer 160, but leaves the portion of conductive layer 160 in vias 134 to form TSVs 164, as shown in FIGS. 7d and 7e.

Figure 8:
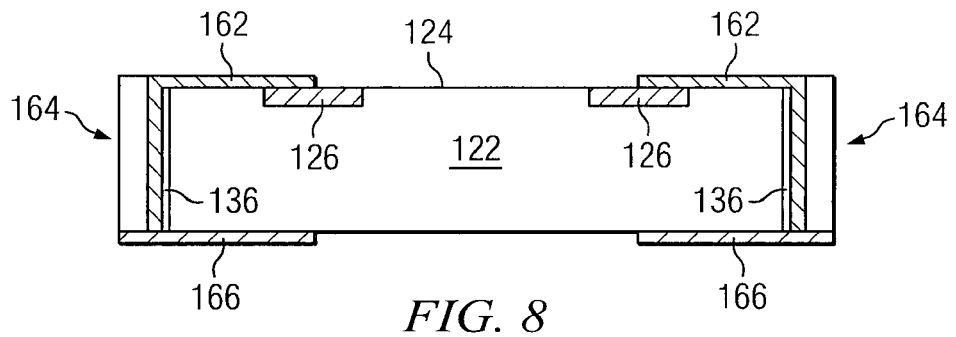
FIG. 8 illustrates the semiconductor device with conductive vias and backside RDL.

FIG. 8 shows RDL 166 formed on a back surface of semiconductor die 122. RDL 166 is electrically connected to TSV 164.

The simultaneous formation of conductive layer 162 and conductive layer 160 in vias 134 to form TSVs 146 simplifies the manufacturing process. The larger area and lower aspect ratio of trench 132 accelerates the formation (e.g., plating) of conductive layer 160 to fill vias 134. Trench 132 reduces void formation. TSVs 164 are formed along the edge of semiconductor die 122 to dissipate stress inside via 134 to the peripheral area.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a semiconductor wafer including a plurality of semiconductor die separated by a peripheral region around the semiconductor die;
   a plurality of vias formed at least partially in the semiconductor die;
   a trench including opposing sidewalls formed in the peripheral region with a portion of the peripheral region remaining between the opposing sidewalls of the trench and the semiconductor die, the trench extending into the vias and continuous from a first via to a second via in the semiconductor die;
   an insulating layer formed over the opposing sidewalls of the trench and a sidewall of the vias;
   a first conductive layer deposited over the insulating layer along the opposing sidewalls of the trench from the first via to the second via and over the sidewall of the vias to form conductive vias; and
   a second conductive layer formed over a first surface of the semiconductor die and electrically connected between the first conductive layer and a contact pad on the semiconductor die.

2. The semiconductor device of claim 1, wherein an area of the trench is larger than an area of the vias.

3. The semiconductor device of claim 1, wherein the first conductive layer is conformally applied in the trench or completely fills the trench.

4. The semiconductor device of claim 1, further including a third conductive layer formed over a second surface of the semiconductor die opposite the first surface of the semiconductor die.

5. The semiconductor device of claim 1, further including a plurality of stacked semiconductor die electrically interconnected through the conductive vias.

6. A semiconductor device, comprising:
   a semiconductor wafer including a plurality of semiconductor die separated by a peripheral region around the semiconductor die;
   a plurality of vias formed in the semiconductor wafer;
   a trench including opposing sidewalls formed in the peripheral region with a portion of the peripheral region remaining between the opposing sidewalls of the trench and the semiconductor die, the trench extending from a first via to a second via in the semiconductor wafer;
   a first conductive layer deposited along the opposing sidewalls of the trench from the first via to the second via and over the sidewall of the vias to form conductive vias; and
   a second conductive layer formed over a first surface of the semiconductor die and electrically connected to the first conductive layer.

7. The semiconductor device of claim 6, wherein an area of the trench is larger than an area of the vias.

8. The semiconductor device of claim 6,
   further including a third conductive layer formed over a second surface of the semiconductor die opposite the first surface of the semiconductor die.

9. The semiconductor device of claim 6, wherein the first conductive layer is conformally applied in the trench or completely fills the trench.

10. The semiconductor device of claim 6, further including a plurality of stacked semiconductor die electrically interconnected through the conductive vias.

11. A semiconductor device, comprising:
    a semiconductor wafer including a plurality of semiconductor die separated by a peripheral region around the semiconductor die;
    a via formed at least partially in the semiconductor die;
    a trench including opposing sidewalls formed continuously along an entire length of the peripheral region of the semiconductor die; and
    a first conductive layer deposited in the trench and via to form a conductive via.

12. The semiconductor device of claim 11, further including an insulating layer formed in the trench and via.

13. The semiconductor device of claim 11, further including a second conductive layer formed over a surface of the semiconductor die, the second conductive layer being electrically connected to the first conductive layer.

14. The semiconductor device of claim 11, further including a second conductive layer formed over a surface of the semiconductor die, the second conductive layer being electrically connected between the first conductive layer and a contact pad on the semiconductor die.

15. The semiconductor device of claim 11, wherein an area of the trench is larger than an area of the via.

16. The semiconductor device of claim 11, wherein the first conductive layer is conformally applied in the trench or completely fills the trench.

17. The semiconductor device of claim 11, further including a plurality of stacked semiconductor die electrically interconnected through the conductive via.

18. A semiconductor device, comprising:
    a semiconductor die including a peripheral region around the semiconductor die;
    a via formed in the semiconductor die;
    a trench including opposing sidewalls formed along a continuous length of the peripheral region; and
    a first conductive layer deposited in the trench and via.

19. The semiconductor device of claim 18, further including an insulating layer formed in the trench and via.

20. The semiconductor device of claim 18, wherein the first conductive layer is conformally applied in the trench and partially fills the trench.

21. The semiconductor device of claim 18, further including a second conductive layer formed over a surface of the semiconductor die, the second conductive layer being electrically connected between the first conductive layer and a contact pad on the semiconductor die.

22. The semiconductor device of claim 18, wherein an area of the trench is larger than an area of the via.

23. The semiconductor device of claim 18, wherein the first conductive layer is conformally applied in the trench or completely fills the trench.

24. The semiconductor device of claim 18, further including a plurality of stacked semiconductor die electrically interconnected through the first conductive layer deposited in the via.

25. The semiconductor device of claim 6, wherein the vias are partially within the semiconductor die.

26. A semiconductor device, comprising:
    a semiconductor wafer including a plurality of semiconductor die separated by a peripheral region;
    a plurality of vias formed in the semiconductor wafer;
    a trench that is continuous in the peripheral region of the semiconductor wafer; and
    a first conductive layer deposited in the trench and vias to form conductive vias.

27. The semiconductor device of claim 26, wherein an area of the trench is larger than an area of the vias.

28. The semiconductor device of claim 26, wherein the first conductive layer is conformally applied in the trench or completely fills the trench.

29. The semiconductor device of claim 26, further including a plurality of stacked semiconductor die electrically interconnected through the conductive vias.

30. The semiconductor device of claim 26, further including:
   an insulating layer formed in the trench and vias; and
   a second conductive layer formed over a first surface of the semiconductor die and electrically connected to the first conductive layer.

31. The semiconductor device of claim 30, further including a third conductive layer formed over a second surface of the semiconductor die opposite the first surface of the semiconductor die.

* * * * *